United States Patent
Lambrecht et al.

(10) Patent No.: US 6,775,809 B1
(45) Date of Patent: Aug. 10, 2004

(54) TECHNIQUE FOR DETERMINING PERFORMANCE CHARACTERISTICS OF ELECTRONIC SYSTEMS

(75) Inventors: Frank Lambrecht, Mountain View, CA (US); Ching-Chao Huang, San Jose, CA (US); Michael Fox, Provo, UT (US)

(73) Assignee: Rambus Inc., Los Altos, CA (US)

( * ) Notice: Subject to any disclaimer, the term of this patent is extended or adjusted under 35 U.S.C. 154(b) by 92 days.

(21) Appl. No.: 10/097,133

(22) Filed: Mar. 14, 2002

(51) Int. Cl.[7] .................. G06F 17/50; G06F 19/00; G06F 13/00; H03D 1/00; H03K 5/26

(52) U.S. Cl. .............. 716/4; 703/16; 703/17; 703/20; 702/64; 702/125; 375/342; 375/295; 327/33; 327/37; 327/51; 327/63; 327/91

(58) Field of Search ................ 716/4; 703/16, 703/17, 20; 702/64, 125; 375/342, 295; 327/33, 37, 51, 63, 91

(56) References Cited

U.S. PATENT DOCUMENTS

| | | | | |
|---|---|---|---|---|
| 4,590,600 A | * | 5/1986 | Beeman et al. | ............. 375/346 |
| 5,361,398 A | * | 11/1994 | Christian et al. | ........... 455/503 |
| 5,566,214 A | * | 10/1996 | Kroeger et al. | ............. 375/355 |
| 6,578,180 B2 | * | 6/2003 | Tanner | ........................ 716/4 |
| 6,625,239 B1 | * | 9/2003 | Shiraishi et al. | ............ 375/354 |

FOREIGN PATENT DOCUMENTS

EP     508459 A2 * 10/1992    ......... H04N/17/00

* cited by examiner

*Primary Examiner*—Matthew Smith
*Assistant Examiner*—Phallaka Kik
(74) *Attorney, Agent, or Firm*—Hunton & Williams LLP

(57) ABSTRACT

A technique for determining performance characteristics of electronic systems is disclosed. In one exemplary embodiment, the technique may be realized as a method for determining performance characteristics of electronic systems. The method includes the steps of measuring a first response on a transmission medium from a falling edge transmitted on the transmission medium, and measuring a second response on the transmission medium from a rising edge transmitted on the transmission medium. The method also includes the step of determining worst case bit patterns for transmission on the transmission medium based upon the first response and the second response.

31 Claims, 6 Drawing Sheets

Rising Edge

TECHNIQUE FOR DETERMINING PERFORMANCE CHARACTERISTICS OF ELECTRONIC SYSTEMS

FIELD OF THE INVENTION

The present invention relates generally to integrated circuit testing techniques and, more particularly, to a technique for determining performance characteristics of electronic systems.

BACKGROUND OF THE INVENTION

A typical transmission system comprises a transmitter, a receiver, and some form of transmission medium for carrying a signal from the transmitter to the receiver. A common problem that occurs in such a transmission system is that the signal arriving at the receiver may be distorted by Inter-Symbol Interference (ISI), or some other form of interference inflicted upon the signal. That is, the waveform (timing and voltage) of the signal transmitted by the transmitter may differ from the waveform of the signal received by the receiver. Most transmission systems are designed such that the system can accurately use the received signal to decipher, or as a representation of, the transmitted signal as long as the timing and voltage of the received signal are within the timing and voltage margins of the system.

ISI generally occurs due to two mechanisms. First, the timing or voltage of a signal presently being transmitted on any given transmission medium may be affected by residual reflections from prior transmitted signals on the same transmission medium. Second, adjacent transmission media may have electromagnetic coupling. In such a case, the timing or voltage of signals transmitted on a given transmission medium may be influenced by signals transmitted on other adjacent transmission mediums.

When testing transmission systems, the operation of such systems is often measured by transmitting long sequences of random data. To some degree, the accuracy of this approach depends upon the probability of the random data sequences containing a worst case data pattern (i.e., the data pattern is resulting in the greatest amount of distortion to a received signal). The accuracy of this approach is also dependent upon whether there is ISI or some other form of interference associated with the device or system. Further, the measurement apparatus may exhibit ISI or some other form of interference, thereby introducing an additional uncertainty. In some cases, guard-banding is employed to deal with these uncertainties.

Referring to FIG. 1, there is shown a typical apparatus for testing the operation of an integrated circuit (IC) memory device 12. The apparatus 10 comprises a vector memory 14 for storing random data sequences. The vector memory 14 is connected to a transmitter 16 for transmitting the random data sequences along a transmission medium 18 to the IC memory device 12. The apparatus 10 also comprises a receiver 20 for receiving data transmitted from the IC memory device 12 via the transmission medium 18, and a result memory 22, connected to the receiver 20, for storing the received data. The operation of the IC memory device 12 is tested by comparing the random data sequences that are transmitted from the vector memory 14 to the IC memory device 12 for storage therein with the same random data sequences after they are transmitted from the IC memory device 12 to the result memory 22 for storage therein. It should be noted that although only one transmitter 16, transmission medium 18, and receiver 20 are shown, this arrangement may be duplicated as required based upon the number of input/output (I/O) lines of the IC memory device 12 to be measured.

The apparatus 10 can also be used to attempt to measure the worst case timing and voltage margins of the IC memory device 12 by measuring the output waveforms of the random data sequences after they are transmitted from the IC memory device 12 to the result memory 22. However, since there is no way to know when a worst case data pattern will occur, every output waveform must be measured. Also, this method is not guaranteed to find the worst case timing and voltage margins since the random data sequences may not include the worst case data pattern. This is especially true when the outputs of the IC memory device 12 are affected by ISI or some other form of interference. In addition, if the apparatus 10 itself has ISI or some other form of interference, the measurement result will not accurately reflect the true worst case timing and voltage margins of the IC memory device 12.

In view of the foregoing, it would be desirable to provide a technique for determining performance characteristics of electronic systems which overcomes the above-described inadequacies and shortcomings.

SUMMARY OF THE INVENTION

According to the present invention, a technique for determining performance characteristics of electronic systems is provided. In one exemplary embodiment, the technique may be realized as a method for determining performance characteristics of electronic systems. The method includes the steps of measuring a first response on a transmission medium from a falling edge transmitted on the transmission medium, and measuring a second response on the transmission medium from a rising edge transmitted on the transmission medium. The method also includes the step of determining worst case bit patterns for transmission on the transmission medium based upon the first response and the second response.

In accordance with other aspects of this particular exemplary embodiment of the present invention, the method may also beneficially include the step of transmitting the worst case bit patterns from an electronic device onto the transmission medium for determining performance characteristics associated with the electronic device and the transmission medium. The performance characteristics may beneficially include worst case timing margins and/or worst case voltage margins associated with the electronic device and the transmission medium.

In accordance with further aspects of this particular exemplary embodiment of the present invention, the step of measuring a first response on a transmission medium may beneficially include the steps of sampling the voltage of the first response on the transmission medium, calculating the difference between each voltage sample and a steady state reference voltage, and generating a falling edge vector based upon the differences between each voltage sample and the steady state reference voltage. The voltage of the first response on the transmission medium may be periodically or non-periodically sampled.

In accordance with still further aspects of this particular exemplary embodiment of the present invention, the step of measuring a second response on a transmission medium may beneficially include the steps of sampling the voltage of the second response on the transmission medium, calculating the difference between each voltage sample and a steady state id reference voltage, and generating a rising edge vector based upon the differences between each voltage sample and the steady state reference voltage. The voltage of the second response on the transmission medium may be periodically or non-periodically sampled.

In accordance with additional aspects of this particular exemplary embodiment of the present invention, the step of determining worst case bit patterns may beneficially include determining worst case timing margin bit patterns and/or worst case voltage margin bit patterns for transmission on the transmission medium. For example, the step of determining worst case bit patterns may beneficially include the step of choosing a type of signal degradation parameter from a low side signal degradation, a high side signal degradation, a signal edge pull-in, or a signal edge push-off. The step of determining worst case bit patterns may also beneficially include the step of choosing an ending condition from a low output voltage level or a high output voltage level. The step of determining worst case bit patterns may also beneficially include the step of analyzing a falling edge vector generated based upon the first response or a rising edge vector generated based upon the second response to determine whether or not a state transition will cause a desired signal degradation at the ending condition. The step of determining worst case bit patterns may also beneficially include the step of analyzing the falling edge vector or the rising edge vector to determine whether or not a state transition will cause a desired signal degradation at each previously occurring bit time. This last step is beneficially. repeated using a desired amount of the falling edge vector and the rising edge vector.

In an alternative exemplary embodiment, the technique may be realized as an integrated circuit device having a transmitter for transmitting signals from the integrated circuit device onto a transmission medium. The integrated circuit device comprises a falling edge generator electrically connected to the transmitter for generating a falling edge signal for transmission by the transmitter onto the transmission medium so as to provide a falling edge response associated with the transmission medium for generating an associated falling edge vector. The integrated circuit device also comprises a rising edge generator electrically connected to the transmitter for generating a rising edge signal for transmission by the transmitter onto the transmission medium so as to provide a rising edge response associated with the transmission medium for generating an associated rising edge vector. In accordance with this particular exemplary embodiment of the present invention, if the falling edge generator and the rising edge generator may be formed in a combined falling/rising edge generator.

In another alternative exemplary embodiment, the technique may be realized as an integrated circuit device having a receiver for receiving signals from a transmission medium. The integrated circuit device comprises a sampling and differencing circuit electrically connected to the transmission medium for sampling a signal propagating along the transmission medium prior to being received by the receiver, and for calculating the difference between a sampled signal value and a reference value.

The present invention will now be described in more detail with reference to exemplary embodiments thereof as shown in the appended drawings. While the present invention is described below with reference to preferred embodiments, it should be understood that the present invention is not limited thereto. Those of ordinary, skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1:
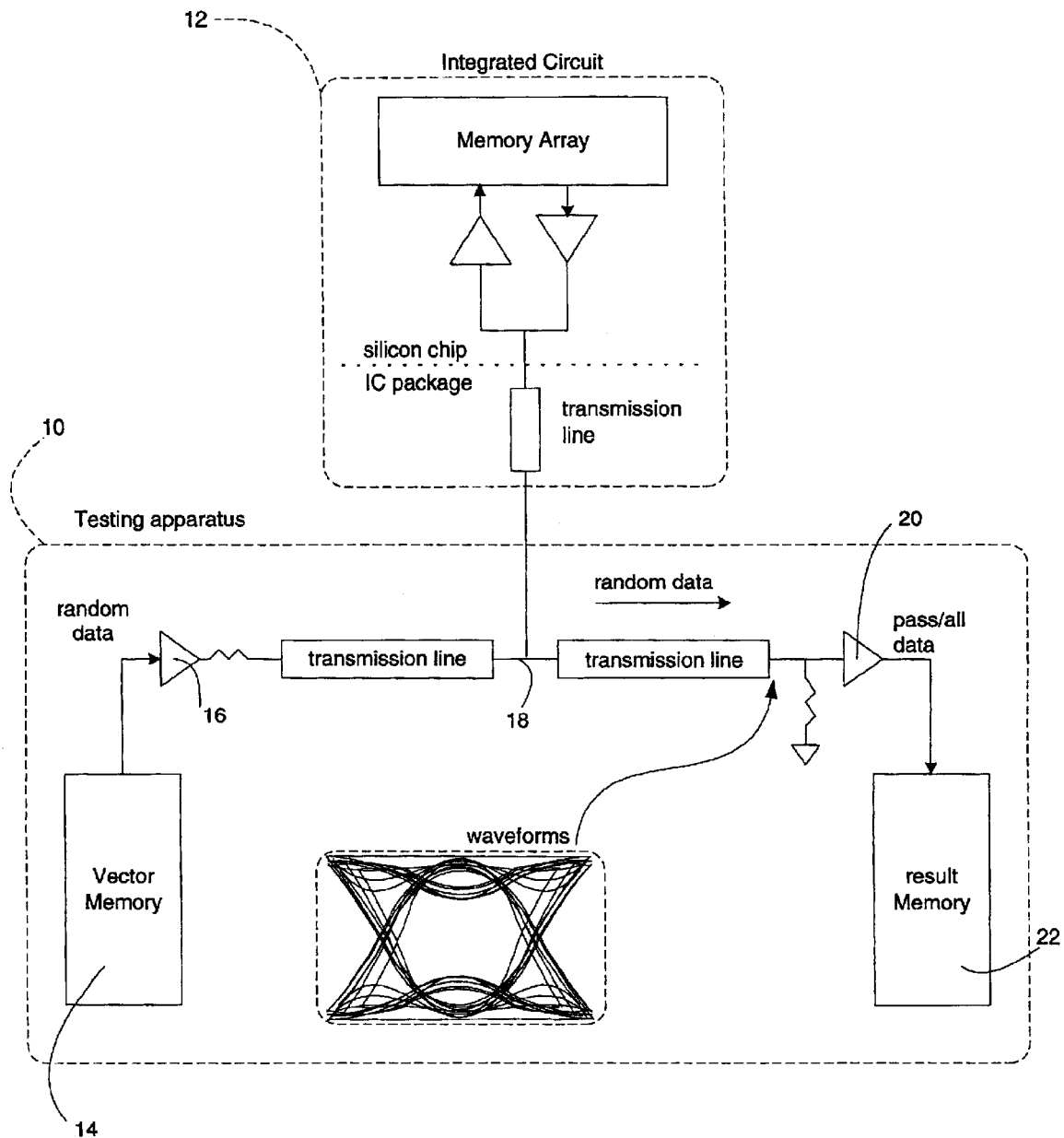
FIG. 1 shows a typical prior art apparatus for testing the operation of an integrated circuit (IC) memory device.
Figure 2:
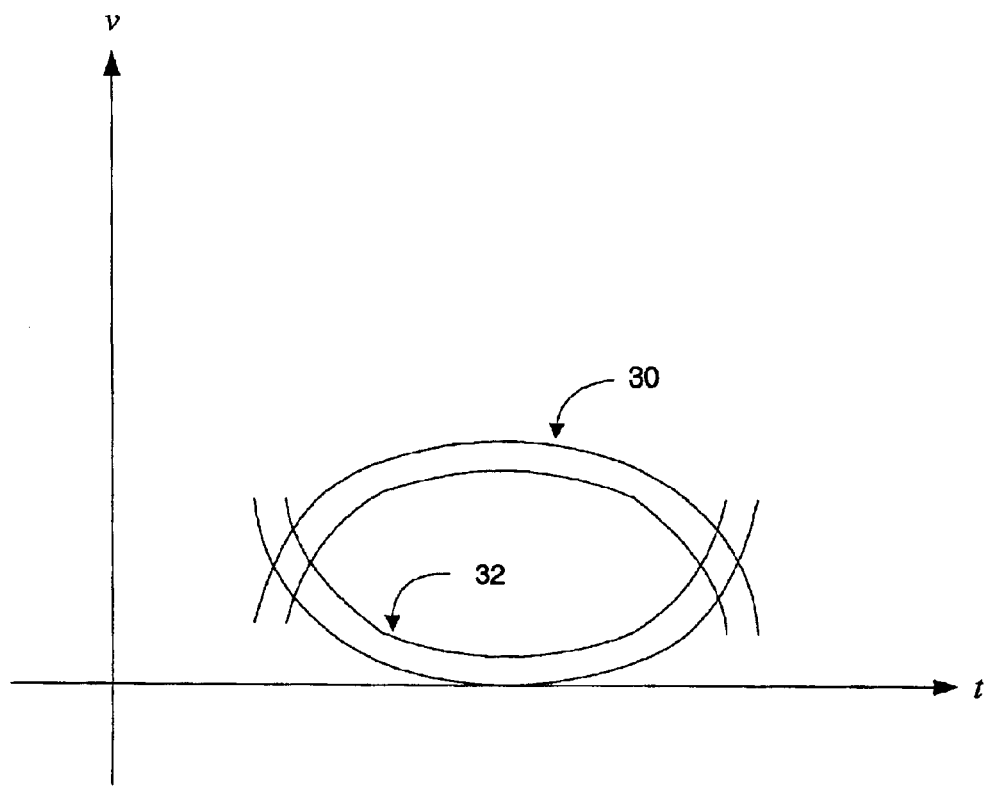
FIG. 2 shows a graph indicating a typical output voltage waveform range for a logic one pulse and a typical output voltage waveform range for a logic zero pulse for an integrated circuit (IC) device.

By way of introduction to the present invention, FIG. 2 shows a graph indicating a typical output voltage waveform range 30 for a logic one pulse and a typical output voltage waveform range 32 for a logic zero pulse for an integrated circuit (IC) device (not shown). These output voltage waveform ranges 30 and 32 apply to the IC device as it operates within a particular system. That is, depending upon system operating conditions, these output voltage waveform ranges 30 and 32 may vary. For this reason, the output voltage waveform ranges 30 and 32 are typically industry standards, which are established assuming a defined set of system operating conditions. This is done to insure that similar IC devices operate in a similar manner under similar system operating conditions.

Unfortunately, the defined set of system operating conditions is not all-inclusive. That is, the defined set of system operating conditions does not include several operating conditions that are typically present in any particular system. For example, ISI, humidity, and other system operating conditions may adversely affect the operation of the IC device. That is, the IC device will typically provide a logic one pulse such that it falls within the output voltage waveform range 30, and a logic zero pulse such that it falls within the output voltage waveform range 32. However, depending upon these other system operating conditions, the IC device may provide a logic one pulse that falls outside the output voltage waveform range 30, and a logic zero pulse that falls outside the output voltage waveform range 32. If this happens, an error may occur if the logic one pulse is not properly detected as a logic one pulse, or the logic zero pulse is not properly detected as a logic zero pulse.

Figure 3:
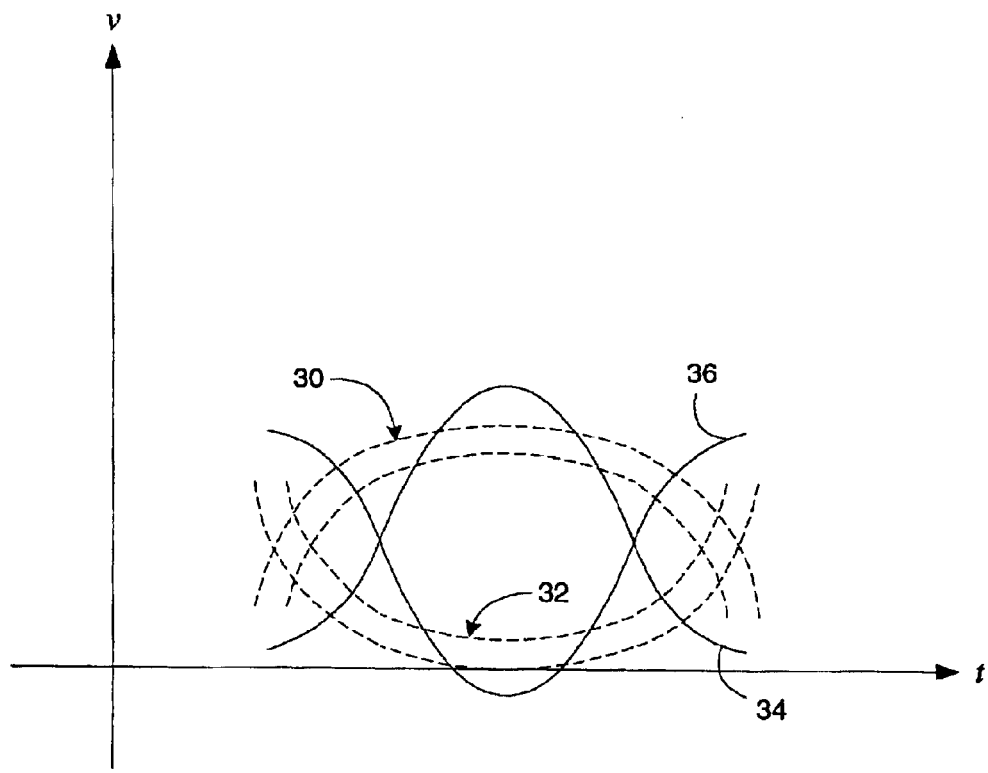
FIG. 3 shows a graph indicating a logic one pulse having rising and falling edges that fall outside the output voltage waveform range of FIG. 2, and a logic zero pulse having rising and falling edges that fall outside the output voltage waveform range of FIG. 2.
Figure 4:
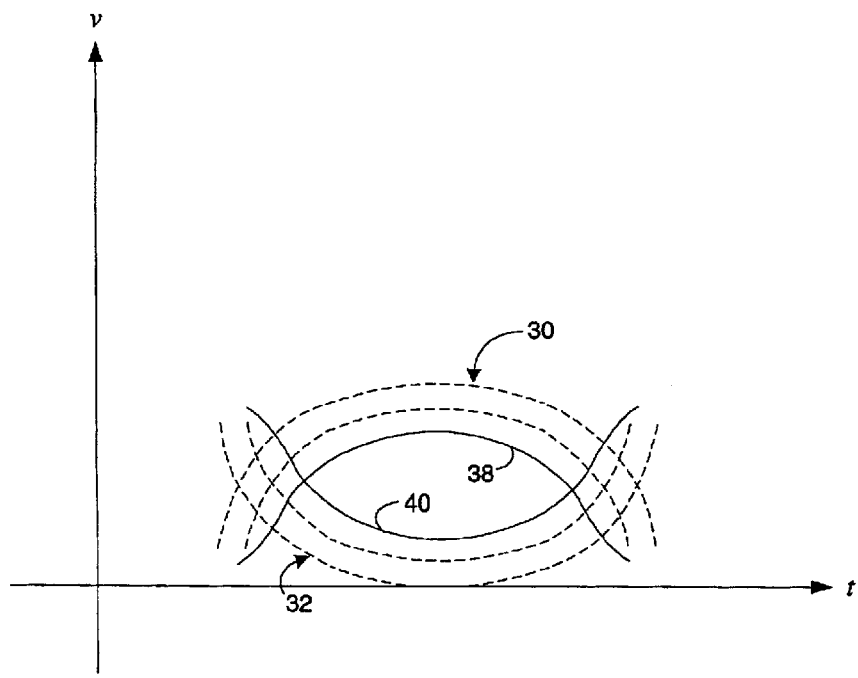
FIG. 4 shows a graph indicating a logic one pulse having a voltage level that falls outside the output voltage waveform range of FIG. 2, and a logic zero pulse having a voltage level that falls outside the output voltage waveform range of FIG.

Referring to FIG. 3, there is shown a condition wherein the IC device provides a logic one pulse 34 having rising and falling edges that fall outside the output voltage waveform range 30. Similarly, FIG. 3 also shows a condition wherein the IC device provides a logic zero pulse 36 having rising and falling edges that fall outside the output voltage waveform range 32. Also, referring to FIG. 4, there is shown a condition wherein the IC device provides a logic one pulse 38 having a voltage level (i.e., $V_{oh}$ level) that falls outside the output voltage waveform range 30. Similarly, FIG. 4 also shows a condition wherein the IC device provides a logic zero pulse 40 having a voltage level (i.e., $V_{ol}$) that falls outside the output voltage waveform range 32.

The operating conditions that cause an IC device to provide output signals that fall outside the typical output voltage waveform ranges (i.e., outside output voltage waveform ranges 30 and 32) are commonly called the worst case operating conditions. These worst case operating conditions may result from ISI, humidity, and other deleterious affects. In any event, it is important to know how an IC device operates under these worst case operating conditions, and when these worst case operating conditions occur for each particular IC device. The following description sets forth a methodology for determining a worst case bit pattern for an IC device, and for determining a worst case output voltage response associated with that worst case bit pattern.

Figure 5:
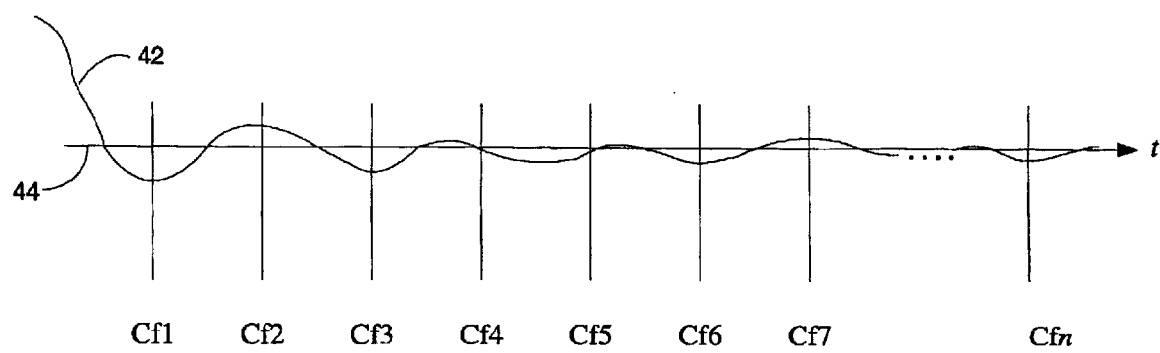
FIG. 5 shows a graph indicating a typical falling edge output voltage waveform for an IC device that is periodically sampled until a steady state output voltage level is reached in accordance with an embodiment of the present invention.

Referring to FIG. 5, there is shown a graph indicating a typical falling edge output voltage waveform 42 for an IC device (not shown). The falling edge output voltage waveform 42 is periodically (or alternatively non-periodically) sampled until a steady state output voltage level 44 is reached. The steady state output voltage level 44 may be defined by several standards such as, for example, when the output voltage level has a swing that does not vary by more than 0.51%.

At each sampling point (Cfx), the difference (Dfx) between the sampled voltage level and the steady state voltage level 44 is calculated. A falling edge vector is then generated based upon these differences (Dfx) in voltage level values. For example, the falling edge vector, F=(Df1, Df2, Df3, Df4, Df5, Df6, . . . , Dfn)

is generated, wherein Dfx=Cfx—steady state voltage level 44.

Figure 6:
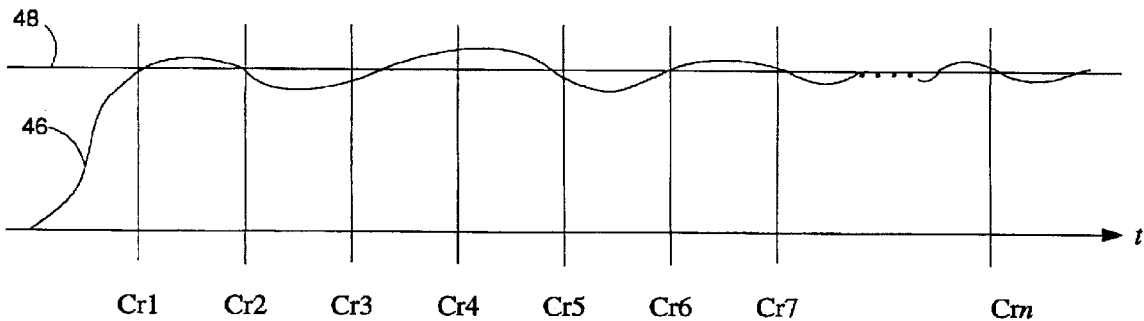
FIG. 6 shows a graph indicating a typical rising edge output voltage waveform for an IC device that is periodically sampled until a steady state output voltage level is reached in accordance with an embodiment of the present invention.

Similarly, referring to FIG. 6, there is shown a graph indicating a typical rising edge output voltage waveform 46 for the IC device (not shown). The rising edge output voltage waveform 46 is periodically (or alternatively non-periodically) sampled until a steady state output voltage level 48 is reached. The steady state output voltage level 48 may be defined by several standards such as, for example, when the output voltage level has a swing that does not vary by more than 0.5%.

At each sampling point (Crx), the difference (Drx) between the sampled voltage level and the steady state voltage level 48 is calculated. A rising edge vector is then generated based upon these differences (Drx) in voltage level values. For example, the rising edge vector, R=(Dr1, Dr2, Dr3, Dr4, Dr5, Dr6, . . . , Drn)

is generated, wherein Drx=Crx—steady state voltage level 48.

Figure 7:
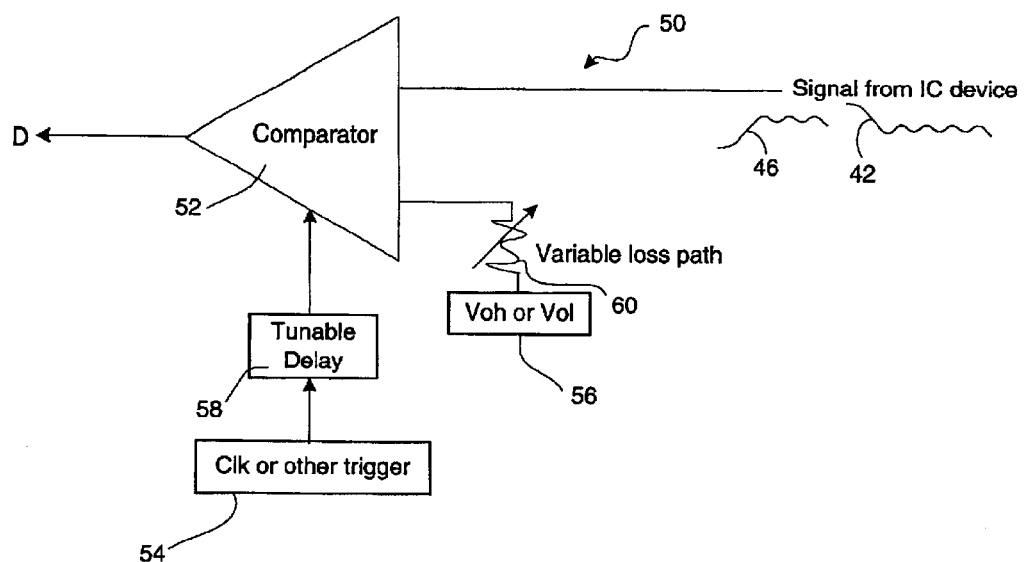
FIG. 7 shows a sampling and differencing circuit for periodically sampling the output voltage from an IC device, and for calculating the difference between the sampled output voltage and a steady state reference voltage, in accordance with an embodiment of the present invention.

Referring to FIG. 7, there is shown a sampling and differencing circuit 50 for periodically (or alternatively non-periodically) sampling an output voltage signal from the IC device, and for calculating the difference between the sampled output voltage and a steady state reference voltage. The sampling and differencing circuit 50 comprises a comparator 52, a trigger circuit 54, a reference voltage circuit 56, an optional tunable delay circuit 58, and an optional variable loss path circuit 60. The output voltage signal from the IC device (either a falling edge signal 42 or a rising edge signal 46) is provided to the comparator 52. This output voltage signal from the IC device is compared against a reference voltage (e.g., Vol for a falling edge, Voh for a rising edge) provided by the reference voltage circuit 56. This comparison is periodically (or alternatively non-periodically) conducted based upon the frequency or other triggering measure of the trigger circuit 54. The comparator 52 outputs a difference signal, D, for use in generating a falling or rising edge vector, F or R, respectively. It should be noted that the level of the reference voltage is typically updated based upon feedback received from the output of the comparator 52.

The frequency or other triggering measure of the comparison may be varied using, for example, the optional tunable delay circuit 58. Also, the reference voltage may be varied using, for example, the optional variable loss path circuit 60, or other means to allow for better resolution of AC signal levels at sampling times. Further, the sampling and differencing circuit 50 could be replaced with an analog-to-digital converter, or some other circuitry that is functionally equivalent to the sampling and differencing circuit 50.

At this point is should be noted that, although voltage is sampled and used above to generate the falling and rising edge vectors, F and R, respectively, other signaling metrics may be used in accordance with the present invention. For example, the signaling metric could be sampled current or energy output from the IC device, or a weighted function over time. The weighted function over time could include hardware specific effects, and could use different measures than exact voltages to determine the effects.

Using the falling and rising edge vectors, F and R, respectively, the output voltage response from an arbitrary bit pattern may be predicted or approximated for the IC device. For example, the output voltage response, V(t), for bit pattern 10001000 (reading left to right from bit 0 to bit 7) may be predicted or approximated as follows:

At time t0, the output voltage response is equal to the value of bit 0 (i.e., Voh). Thus, V(t0)=Voh.

At time t1, since a state transition occurs, the output voltage response is equal to the value of bit 0 (i.e., Voh)

minus Δ plus Df1 (wherein ΔA=Voh−Vol, which represents a state change in the bit pattern). Thus, V(t1)=Voh−Δ+Df1.

At time t2, since no state transition occurs, the output voltage response is equal to the value of bit 0 (i.e., Voh) minus Δ plus Df2. Thus, V(t2)=Voh−Δ+Df2.

At time t3, since no state transition occurs, the output voltage response is equal to the value of bit 0 (i.e., Voh) minus Δ plus Df3. Thus, V(t3)=Voh−Δ+Df3.

At time t4, since a state transition occurs, the output voltage response is equal to the value of bit 0 (i.e., Voh) minus Δ plus Δ plus Df4 plus Dr1. Thus, V(t4)=Voh−Δ+Δ+Df4+Dr1.

At time t5, since a state transition occurs, the output voltage response is equal to the value of bit 0 (i.e., Voh) minus Δ plus Δ minus Δ plus Df5 plus Dr2 plus Df1. Thus, V(t5)=Voh−Δ+Δ−Δ+Df5+Dr2+Df1.

At time t6, since no state transition occurs, the output voltage response is equal to the value of bit 0 (i.e., Voh) minus Δ plus Δ minus Δ plus Df6 plus Dr3 plus Df2. Thus, V(t6)=Voh−Δ+Δ−Δ+Df6+Dr3+Df2.

At time t7, since no state transition occurs, the output voltage response is equal to the value of bit 0 (i.e., Voh) minus Δ plus Δ minus Δ plus Df7 plus Dr4 plus Df3. Thus, V(t7)=Voh−Δ+Δ−Δ+Df7+Dr4+Df3.

The above pattern continues until all of the falling and rising edge vector values are used, at which point only a steady state output voltage response remains. Thus, the overall output voltage response, V(t), may be defined as V(t0)+V(t1)+V(t2)+V(t3)+V(t4)+V(t5)+V(t60)+V(t7)+....

Using the falling and rising edge vectors, F and R, respectively, the worst case bit pattern for the IC device can be determined, as well as the worst case output voltage response associated with that worst case bit pattern. Of course, there may be eight different worst case bit patterns for the IC device depending upon the type of signal degradation parameter (i.e., low side signal degradation, high side signal degradation, signal edge pull-in, or signal edge push-off) and the type of ending condition (i.e., Vol or Voh) that is of interest. That is, low side signal degradation occurs when the output voltage response for a logic zero state rises above Vol, high side signal degradation occurs when the output voltage response for a logic one state drops below Voh, signal edge pull-in occurs when the output voltage response for a logic state transition occurs early, and signal edge push-off occurs when the output voltage response for a logic state transition occurs late. Also, a Vol ending condition occurs when a logic zero state should be present, and a Voh ending condition occurs when a logic one state should be present. Accordingly, there may be eight different worst case bit patterns for the IC device, and each of these eight worst case bit patterns for the IC device may be determined using the falling and rising edge vectors, F and R, respectively.

The method for determining any of the worst case bit patterns for the IC device begins by first choosing the type of signal degradation parameter (i.e., low side signal degradation, high side signal degradation, signal edge pull-in, or signal edge push-off). An ending condition must then be chosen (i.e., either Vol or Voh). Next, the falling and rising edge vectors, F and R, respectively, must be analyzed to determine whether or not a state transition will cause a desired signal degradation at the ending condition. Next, the falling and rising edge vectors, F and R, respectively, must be analyzed to determine whether or not a state transition will cause a desired signal degradation at each previously occurring bit time. This last step is repeated until a desired amount of the falling and rising edge vectors, F and R, respectively, are used. A worst case pattern will result for the chosen type of signal degradation parameter and ending condition.

By way of a first example, assume the following values for the falling and rising edge vectors, F and R, respectively:

F=(0, 0.1, 0.1, −0.1, 0.05)

R=(0.1, 0, −0.1, 0.05, 0.05)

Using the above falling and rising edge vectors, F and R, respectively, assume that the worst case bit pattern for low side signal degradation is desired. Also, assume an ending condition of Vol has been chosen. The goal of low side signal degradation is to maximize the positive AC effects on the low side of the output voltage response. For each bit time, the worst case bit pattern is determined as follows:

Bit 4: Since the ending condition of Vol (at bit 5) has been chosen, the logic level of bit 4 must be determined based upon the effects of a falling edge or no edge, which are the only possibilities that may be used to arrive at the ending condition of Vol (at bit 5). Since Df1=0, a falling edge does not cause any positive low side signal degradation at bit 5. Thus, bit 4 should have a logic level of Vol.

Bit 3: Since bit 4 is at Vol, the logic level of bit 3 must be determined based upon the effects of a falling edge or no edge, which are the only possibilities that may be used to arrive at the logic level of Vol at bit 4. Since Df2=0.1, a falling edge causes positive low side signal degradation at bit 4. Thus, bit 3 should have a logic level of Voh.

Bit 2: Since bit 3 is at Voh, the logic level of bit 2 must be determined based upon the effects of a rising edge or no edge, which are the only possibilities that may be used to arrive at a logic level of Voh at bit 3. Since Dr3=−0.1, a rising edge does not cause any positive low side signal degradation at bit 3. Thus, bit 2 should have a logic level of Voh.

Bit 1: Since bit 2 is at Voh, the logic level of bit 1 must be determined based upon the effects of a rising edge or no edge, which are the only possibilities that may be used to arrive at a logic level of Voh at bit 2. Since Dr4=0.05, a rising edge causes positive low side signal degradation at bit 2. Thus, bit 1 should have a logic level of Vol.

Bit 0: Since bit 1 is at Vol, the logic level of bit a must be determined based upon the effects of a falling edge or no edge, which are the only possibilities that may be used to arrive at a logic level of Vol at bit 1. Since Df5=0.05, a falling edge causes positive low side signal degradation at bit 1. Thus, bit 0 should have a logic level of Voh.

In view of the foregoing, the worst case bit pattern for low side signal degradation and an ending condition of Vol for the IC device is 101100 (reading left to right from bit 0 to bit 5). This worst case bit pattern causes low side signal degradation at bit 5 in the amount of Vol+0.2=Vol+0 +0.1+ 0+0.05+0.05=Vol+0+Df2+0+Dr4+Df5. Of course, this worst case bit pattern and the resulting low side signal degradation at bit 5 is based upon the above-defined falling and rising edge vectors, F and R, respectively.

By way of a second example, assume the same values for the falling and rising edge vectors, F and R, respectively, as defined above. Using the above-defined falling and rising edge vectors, F and R, respectively, assume that the worst case bit 19 pattern for high side signal degradation is desired. Also, assume an ending condition of Voh has been chosen. The goal of high side signal degradation is to maximize the negative AC effects on the high side of the output voltage response. For each bit time, the worst case bit pattern is determined as follows:

Bit 4: Since the ending condition of Voh (at bit 5) has been chosen, the logic level of bit 4 must be determined based upon the effects of a rising edge or no edge, which are the only possibilities that may be used to arrive at the ending condition of Voh (at bit 5). Since Dr1=0.1, a rising edge does not cause any negative high side signal degradation at bit 5. Thus, bit 4 should have a logic level of Voh.

Bit 3: Since bit 4 is at Voh, the logic level of bit 3 must be determined based upon the effects of a rising edge or no edge, which are the only possibilities that may be used to arrive at the logic level of Voh at bit 4. Since Dr2=0, a rising edge does not cause any negative high side signal degradation at bit 4. Thus, bit 3 should have a logic level of Voh.

Bit 2: Since bit 3 is at Voh, the logic level of bit 2 must be determined based upon the effects of a rising edge or no it edge, which are the only possibilities that may be used to arrive at a logic level of Voh at bit 3. Since Dr3=−0.1, a rising edge causes negative high side signal degradation at bit 3. Thus, bit 2 should have a logic level of Vol.

Bit 1: Since bit 2 is at Vol, the logic level of bit 1 must be determined based upon the effects of a falling edge or no edge, which are the only possibilities that may be used to arrive at a logic level of Vol at bit 2. Since Df4=−0.1, a falling edge causes negative high side signal degradation at bit 2. Thus, bit 1 should have a logic level of Voh.

Bit 0: Since bit 1 is at Voh, the logic level of bit 0 must be determined based upon the effects of a rising edge or no edge, which are the only possibilities that may be used to arrive at a logic level of Voh at bit 1. Since Dr5=0.05, a rising edge does not cause any negative high side signal degradation at bit 1. Thus, bit 0 should have a logic level of Voh.

In view of the foregoing, the worst case bit pattern for high side signal degradation and an ending condition of Voh for the IC device is 110111 (reading left to right from bit 0 to bit 5). This worst case bit pattern causes high side signal degradation at bit 5 in the amount of Voh−0.2=Voh−0−0−0.1−0.1−0=Voh−0−0−Dr3−Df4−0. Of course, this L worst case bit pattern and the resulting high side signal degradation at bit 5 is based upon the above-defined falling and rising edge vectors, F and R, respectively.

The worst case bit pattern for low side signal degradation and an ending condition of Voh and the worst case bit pattern for high side signal degradation and an ending condition of Vol are determined in a manner similar to the first and second examples set forth above.

The worst case bit patterns for signal edge pull-in and signal edge push-off and ending conditions of Vol and Voh are also determined in a manner similar to the first and second examples set forth above. The worst case bit patterns for signal edge pull-in and signal edge push-off can be determined using the same falling and rising edge vectors, F and R, respectively, that are used to determine the worst case bit patterns for low side signal degradation and high side signal degradation. However, for signal edge pull-in and signal edge push-off, it is preferred to have the voltage waveforms sampled closer to the rising and falling edges.

Figure 8:
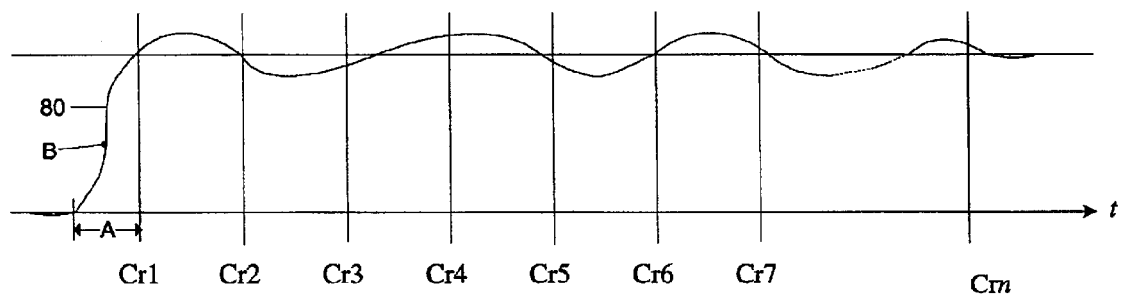
FIG. 8 shows an example of an output voltage response for an IC device for a last bit transition of low-to-high that is periodically sampled until a steady state output voltage level is reached in accordance with the present invention.
Figure 9:
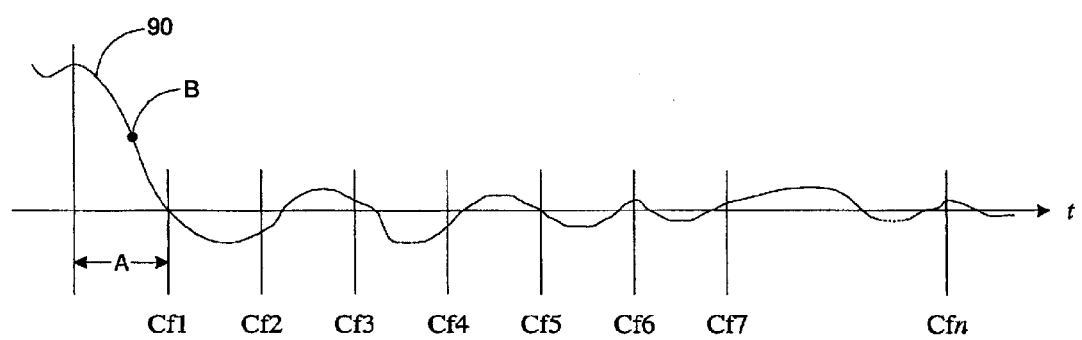
FIG. 9 shows an example of an output voltage response for an IC device for a last bit transition of high-to-low that is periodically sampled until a steady state output voltage level is reached in accordance with the present invention.

For signal edge pull-in and signal edge push-off, an assumption must be made about the last bit transition (i.e., high-to-low or low-to-high). Referring to FIG. 8, there is shown an example of an output voltage response 80 for the IC device for a last bit transition of low-to-high. For signal edge push-off, the voltage in range A of FIG. 8 should be lowered. For signal edge pull-in, the voltage in range A of FIG. 8 should be raised. Referring to FIG. 9, there is shown an example of an output voltage response 90 for the IC device for a last bit transition of high-to-low. For signal edge push-off, the voltage in range A of FIG. 9 should be raised. For signal edge pull-in, the voltage in range A of FIG. 9 should be lowered.

One way to achieve signal edge push-off or signal edge pull-in within range A in FIGS. 8 and 9 is to target a point such as point B in FIGS. 8 and 9. To determine how a bit pattern impacts point B in FIGS. 8 and 9, the rising edge waveform of FIG. 8 and the falling edge waveform of FIG. 9 are each sampled to determine the voltage values at periodic (or alternatively non-periodic) intervals from point B in FIGS. 8 and 9. These sampled voltage values are then used to generate rising and falling edge vectors, similar to the above-described rising and falling edge vectors, R and F, respectively. These generated rising and falling edge vectors can then be used in a ,manner similar to the above-described rising and falling edge is vectors, R and F, respectively, to determine an increase or decrease in the voltage level at point B in FIGS. 8 and 9. Thus, these generated rising and falling edge vectors can be used to determine the worst case push-off/pull-in bit patterns for the IC device, as well as the worst case output voltage response associated with those worst case bit patterns. These generated rising and falling edge vectors can also be used to predict or approximate the output voltage response of the IC device for an arbitrary bit pattern.

Once the worst case bit patterns for the IC device are determined, the performance characteristics of the IC device can then also be determined. For example, the worst case bit patterns may be transmitted from an electronic device onto a transmission medium for determining performance characteristics associated with the electronic device and the transmission medium. The performance characteristics may include, for example, worst case timing margins and/or worst case voltage margins associated with the electronic device and the transmission medium.

Figure 10:
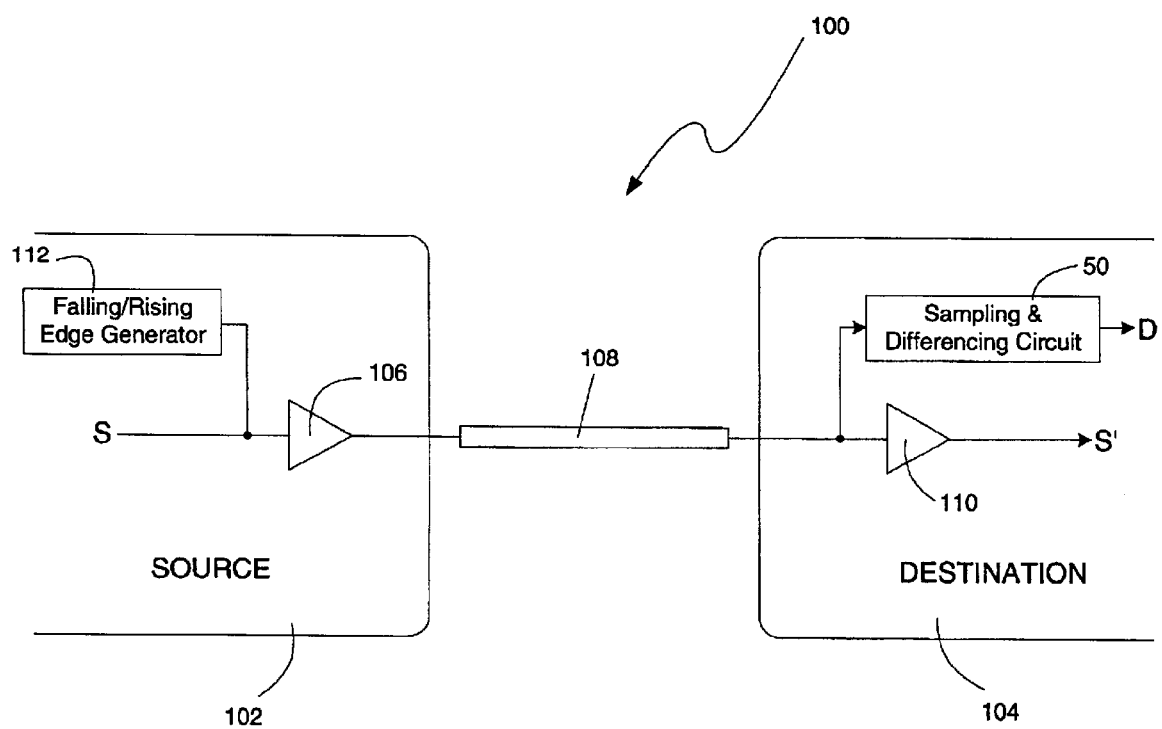
FIG. 10 shows an embodiment of the present invention wherein a falling/rising edge generator is beneficially connected to a transmitter of a transmission system, and a sampling and differencing circuit is beneficially connected to a receiver of the transmission system, such that the worst case performance characteristics of the entire transmission system can be determined.

Referring to FIG. 10, there is shown an embodiment of the present invention wherein a transmission system 100 comprises a source 102 (e.g., a first IC device) and a destination 104 (e.g., a second IC device). The source 102 includes a transmitter 106 for transmitting a signal, S, on a corresponding transmission medium 108. The source 102 also includes a falling/rising edge generator 112 for generating a falling edge or a rising edge for use, in generating the above-described rising and falling edge vectors, R and F, respectively. Of course, the falling/rising edge generator 112 could be formed as a separate falling edge generator and a separate rising edge generator.

The destination 104 includes a receiver 110 for receiving the signal transmitted on the transmission medium 108, and outputting a received signal, S'. The destination 104 also includes the sampling and differencing circuit 50 shown in FIG. 7 for periodically (or alternatively non-periodically) sampling the output voltage from the transmitter 106, and for calculating the difference between the sampled output voltage and a steady state reference voltage. Of course, as previously described, the sampling and differencing circuit 50 could be replaced by an analog-to-digital converter, or some other circuitry that may be used to generate the falling and rising edge vectors, F and R, respectively.

At this point it should be noted that, while only a single transmitter 106, transmission medium 108, receiver 110, falling/rising edge generator 112, and sampling and differencing circuit 50 are shown in FIG. 10, this arrangement of components in the transmission system 100 may be duplicated as required. For example, the source 102 may include a plurality of transmitters 106, the destination 104 may include a respective plurality of receivers 110, and a respective plurality of transmission mediums 108 may connect the plurality of transmitters 106 and the plurality of receivers 110, as is typical in many transmission systems. Each of the plurality of transmitters 106 could then have an associated falling/rising edge generator 112, and each of the plurality of receivers 110 could then have an associated sampling and differencing circuit 50.

The transmission system 100, and specifically the falling/rising edge generator 112 and the sampling and differencing circuit 50, operate such that the worst case performance characteristics of the entire transmission system 100 can be determined in accordance with the present invention as described in detail above.

The above-described technique may be summarized in mathematical terms. That is, the above-described technique includes an attempt to represent an arbitrary function (i.e., output waveform) by a linear combination of some basis functions (i.e., rising- and falling-edge responses). For example, the voltage response, V(t), may be expressed as:

$$V(t)=\text{sum } (a_n R(t+n*t0)+b_n F(t+n*t0))$$

wherein $0<n\leq N$ of interest, and t0 is a bit time.

For a target V(t) (of worst case high/low voltage or pull-in/push-out delay), the coefficients (i.e., bit sequence) of $a_n$ and $b_n$ can be determined in more than one way. That is, while the above-described technique is a (preferred) systematic approach of finding $a_n$ and $b_n$, a brute-force approach may also be used to select the one of interest among all combinations of $a_n$ and $b_n$. It is believed that the former may be more efficient to implement in software, while the latter may be easier to implement in hardware.

Assume that R corresponds to a rising-edge response when starting from a DC steady state of Vol, while F corresponds to a falling-edge response when starting from a DC steady state of Voh. For a linear circuit, R and F form a complete set of basis functions. For nonlinear circuits, more functions may be brought in to form a complete set (because ripples can affect the response). For example, R1, R2, . . . and F1, F2, . . . , can be used where R1 corresponds to a rising-edge response if there is a falling edge 1 bit time before, R2 corresponds to a rising-edge response if there is a falling edge 2 bit time before, etc., and F1 corresponds to a falling-edge response if there is a rising edge 1 bit time before, F2 corresponds to a falling-edge response if there is a rising edge 2 bit time before, etc.

To obtain R1, R2, . . . , and F1, F2, . . . , a single-bit, 2-bit, . . . , response needs to be recorded. Of course, if only R and F are used, it will still be a very good 1st-order approximation in nonlinear circuits.

At this point it should be noted that determining the worst case performance characteristics of an IC device or an entire transmission system in accordance with the present invention as described above typically involves the processing of input data and the generation of output data to some extent. This input data processing and output data generation may be implemented in hardware or software. For example, specific electronic components may be employed in a transmission system or in a testing apparatus for implementing the functions associated with determining the worst case performance characteristics of an IC device or the entire transmission system in accordance with the present invention as described above. Alternatively, a processor operating in accordance with stored instructions may implement the functions associated with determining the worst case performance characteristics of an IC device or an entire transmission system in accordance with the present invention as described above. If such is the case, it is within the scope of the present invention that such instructions may be transmitted to an IC device, a transmission system, or a testing apparatus via one or more signals.

The present invention apparatus and method described herein suffer from none of the drawbacks associated with prior art as described above since the worst case performance is calculated based upon waveforms produced by only a single rising edge and a single falling edge. Also, in accordance with the present invention, a measurement instrument can be measured in advance and an inverse transfer function can be applied to null-out ISI or any other form of interference inherent in the measurement instrument.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for determining performance characteristics of electronic systems, the method comprising the steps of:

measuring a first response on a transmission medium from a falling edge transmitted on the transmission medium;

measuring a second response on the transmission medium from a rising edge transmitted on the transmission medium; and determining worst case bit patterns for transmission on the transmission medium based upon the first response and the second response.

2. The method as defined in claim 1, further comprising the step of:

transmitting the worst case bit patterns from an electronic device onto the transmission medium for determining performance characteristics associated with the electronic device and the transmission medium.

3. The method as defined in claim 2, wherein the performance characteristics include worst case timing margins associated with the electronic device and the transmission medium.

4. The method as defined in claim 2, wherein the performance characteristics include worst case voltage margins associated with the electronic device and the transmission medium.

5. The method as defined in claim 2, wherein the performance characteristics include worst case timing and voltage margins associated with the electronic device and the transmission medium.

6. The method as defined in claim 1, wherein the step of measuring a first response on a transmission medium includes the step of:

sampling the voltage of the first response on the transmission medium.

7. The method as defined in claim 6, wherein the step of sampling the voltage of the first response on the transmission medium includes periodically sampling the voltages of the first response on the transmission medium.

8. The method as defined in claim 6, wherein the step of sampling the voltage of the first response on the transmission medium includes non-periodically sampling the voltage of the first response on the transmission medium.

9. The method as defined in claim 6, wherein the step of measuring a first response on a transmission medium also includes the step of:
calculating the difference between each voltage sample and a steady state reference voltage.

10. The method as defined in claim 9, wherein the step of measuring a first response on a transmission medium also includes the step of:
generating a falling edge vector based upon the differences between each voltage sample and the steady state reference voltage.

11. The method as defined in claim 1, wherein the step of measuring a second response on the transmission medium includes the step of:
sampling the voltage of the second response on the transmission medium.

12. The method as defined in claim 11, wherein the step of sampling the voltage of the second response on the transmission medium includes periodically sampling the voltage of the second response on the transmission medium.

13. The method as defined in claim 11, wherein the step of sampling the voltage of the second response on the transmission medium includes non-periodically sampling the voltage of the second response on the transmission medium.

14. The method as defined in claim 11, wherein the step of measuring a second response on the transmission medium also includes the step of:
calculating the difference between each voltage sample and a steady state reference voltage.

15. The method as defined in claim 14, wherein the step of measuring a second response on the transmission medium also includes the step of:
generating a rising edge vector based upon the differences between each voltage sample and the steady state reference voltage.

16. The method as defined in claim 1, wherein the step of determining worst case bit patterns includes determining worst case timing margin bit patterns for transmission on the transmission medium.

17. The method as defined in claim 1, wherein the step of determining worst case bit patterns includes determining worst case voltage margin bit patterns for transmission on the transmission medium.

18. The method as defined in claim 1, wherein the step of determining worst case bit patterns includes determining worst case timing margin bit patterns and worst case voltage margin bit patterns for transmission on the transmission medium.

19. The method as defined in claim 1, wherein the step of determining worst case bit patterns includes the step of:
choosing a type of signal degradation parameter.

20. The method as defined in claim 19, wherein the step of choosing a type of signal degradation parameter includes choosing a type of signal degradation from one of a low side signal degradation, a high side signal degradation, a signal edge pull-in, and a signal edge push-off.

21. The method as defined in claim 19, wherein the step of determining worst case bit patterns also includes the step of:
choosing an ending condition.

22. The method as defined in claim 21, wherein the step of choosing an ending condition includes choosing an ending condition from one of a low output voltage level and a high output voltage level.

23. The method as defined in claim 21, wherein the step of determining worst case bit patterns also includes the step of:
analyzing one of a falling edge vector generated based upon the first response and a rising edge vector generated based upon the second response to determine whether or not a state transition will cause a desired signal degradation at the ending condition.

24. The method as defined in claim 23, wherein the step of determining worst case bit patterns also includes the step of:
analyzing one of the falling edge vector and the rising edge vector to determine whether or not a state transition will cause a desired signal degradation at each previously occurring bit time.

25. The method as defined in claim 24, wherein the step of determining worst case bit patterns also includes the step of:
repeating the step in claim 24 using a desired amount of the falling edge vector and the rising edge vector.

26. The method as defined in claim 1, further comprising the steps of:
transmitting the falling edge on the transmission medium; and
transmitting the rising edge on the transmission medium.

27. At least one signal embodied in at least one carrier wave for transmitting a computer program of instructions configured to be readable by at least one processor for instructing the at least one processor to execute a computer process for performing the method as recited in claim 1.

28. At least one processor readable carrier for storing a computer program of instructions configured to be readable by at least one processor for instructing the at least one processor to execute a computer process for performing the method as recited in claim 1.

29. A system for determining performance characteristics of electronic systems, the system comprising:
means for measuring a first response on a transmission medium from a falling edge transmitted or the transmission medium;
means for measuring a second response on the transmission medium from a rising edge transmitted on the transmission medium; and
means for determining worst case bit patterns for transmission on the transmission medium based upon the first response and the second response.

30. The system as defined in claim 29, further comprising:
means for transmitting the falling edge on the transmission medium; and
means for transmitting the rising edge on the transmission medium.

31. The system as defined in claim 29, wherein the means for measuring the first response and the second response comprises:
a sampling circuit electrically connected to the transmission medium for sampling a signal propagating along the transmission medium prior to being received by the receiver; and
a differencing circuit for calculating the difference between a sampled signal value and a reference value.

* * * * *